(12) United States Patent
Chen et al.

(10) Patent No.: US 10,423,079 B2
(45) Date of Patent: Sep. 24, 2019

(54) BEARING DEVICE AND EXPOSURE APPARATUS

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Qichao Chen, Beijing (CN); Tzuching Chou, Beijing (CN); Qianhao Han, Beijing (CN)

(73) Assignees: BOE TECHNOLOGY GROUP CO., LTD., Beijing (CN); CHONGQING BOE OPTOELECTRONICS TECHNOLOGY CO., LTD., Beibei, Chongqing (CN)

( * ) Notice: Subject to any disclaimer, the term of this patent is extended or adjusted under 35 U.S.C. 154(b) by 0 days.

(21) Appl. No.: 15/829,375

(22) Filed: Dec. 1, 2017

(65) Prior Publication Data

US 2018/0253019 A1    Sep. 6, 2018

(30) Foreign Application Priority Data

Mar. 6, 2017   (CN) .......................... 2017 1 0129757

(51) Int. Cl.
*G03F 7/20* (2006.01)
*G02F 1/13* (2006.01)
*H01L 27/12* (2006.01)

(52) U.S. Cl.
CPC ............ *G03F 7/707* (2013.01); *G02F 1/1303* (2013.01); *G03F 7/70716* (2013.01);
(Continued)

(58) Field of Classification Search
CPC .. G03F 7/70716; G03F 7/707; G03F 7/70791; G03F 7/70733
See application file for complete search history.

(56) References Cited

U.S. PATENT DOCUMENTS

| 2006/0017005 A1* | 1/2006 | Kim ................... G02F 1/134363 250/441.11 |
| 2007/0159615 A1* | 7/2007 | Horiuchi ............... G03F 7/7075 355/72 |

(Continued)

FOREIGN PATENT DOCUMENTS

CN         104298081 A      1/2015

OTHER PUBLICATIONS

Second Office Action for Chinese Application No. 201710129757.4, dated May 3, 2018, 7 Pages.

*Primary Examiner* — Steven Whitesell Gordon
(74) *Attorney, Agent, or Firm* — Brooks Kushman P.C.

(57) ABSTRACT

The present disclosure provides a bearing device. The bearing device includes a bearing platform, a lifting passage extending through the bearing platform, a lifting structure in the lifting passage and a light reflection compensating block between the lifting structure and an inner wall of the lifting passage. A difference between a reflectivity ratio of a top surface of the light reflection compensating block and a reflectivity ratio of a bearing surface of the bearing platform is less than or equal to a threshold value. A difference between the reflectivity ratio of the top surface of the light reflection compensating block and a reflectivity ratio of a top surface of the lifting structure is less than or equal to the threshold value. The present disclosure further provides an exposure apparatus including the bearing device.

11 Claims, 6 Drawing Sheets

(52) U.S. Cl.
CPC ...... *G03F 7/70733* (2013.01); *G03F 7/70791* (2013.01); *H01L 27/1214* (2013.01)

(56) References Cited

U.S. PATENT DOCUMENTS

| | | | |
|---|---|---|---|
| 2011/0236162 A1* | 9/2011 | Shikayama | H01L 21/68742 414/222.01 |
| 2014/0293257 A1* | 10/2014 | Yoo | G03F 7/70691 355/73 |
| 2016/0111318 A1* | 4/2016 | Ichinose | H01L 21/6838 430/322 |

* cited by examiner the top surface of the lifting structure to a bottom end of the lifting structure, the
BEARING DEVICE AND EXPOSURE APPARATUS

CROSS-REFERENCE TO RELATED APPLICATION

This application claims priority to Chinese Patent Application No. 201710129757.4 filed on Mar. 6, 2017, which is incorporated herein by reference in its entirety.

TECHNICAL FIELD

The present disclosure relates to the field of manufacture of display devices, and in particular to a bearing device and an exposure apparatus.

BACKGROUND

When manufacturing display devices, the exposure process is usually used to process a substrate coated with photoresist. However, exposure rates of the photoresist at different positions of the substrate are different, which easily leads to defective products.

SUMMARY

Embodiments of the present disclosure provide a bearing device and an exposure apparatus, which can solve the problem in the related art that degrees of exposure of photoresist at different positions of one substrate are different.

One embodiment of the present disclosure provides a bearing device, which includes: a bearing platform, a lifting passage extending through the bearing platform, a lifting structure in the lifting passage and a light reflection compensating block between the lifting structure and an inner wall of the lifting passage. A difference between a reflectivity ratio of a top surface of the light reflection compensating block and a reflectivity ratio of a bearing surface of the bearing platform is less than or equal to a threshold value. A difference between the reflectivity ratio of the top surface of the light reflection compensating block and a reflectivity ratio of a top surface of the lifting structure is less than or equal to the threshold value.

Further, an orthographic projection of the light reflection compensating block on a horizontal plane and an orthographic projection of the lifting structure on the horizontal plane together completely cover an orthographic projection of the lifting passage on the horizontal plane.

Further, an orthographic projection of the light reflection compensating block on a plane parallel to the bearing surface of the bearing platform and an orthographic projection of the lifting structure on the plane parallel to the bearing surface of the bearing platform together completely cover an orthographic projection of the lifting passage on the plane parallel to the bearing surface of the bearing platform.

Further, the reflectivity ratio of the top surface of the lifting structure is equal to the reflectivity ratio of the bearing surface of the bearing platform, and the threshold value is 0.

Further, the light reflection compensating block includes a base body and a reflective layer on a top surface of the base body, and a surface of the reflective layer defines the top surface of the light reflection compensating block.

Further, the lifting structure includes a lifting portion and a supporting portion disposed at a top end of the lifting portion; and a top surface of the supporting portion defines the top surface of the lifting structure.

Further, the supporting portion is a plate structure.

Further, the light reflection compensating block is disposed at a top end of the inner wall of the lifting passage in such a manner that when the top surface of the supporting portion is coplanar with the bearing surface of the bearing platform, the top surface of the supporting portion, the top surface of the light reflection compensating block and the bearing surface of the bearing platform together define a continuous plane.

Further, the light reflection compensating block is disposed at a lateral side of the supporting portion in such a manner that when the top surface of the supporting portion is coplanar with the bearing surface of the bearing platform, the top surface of the supporting portion, the top surface of the light reflection compensating block and the bearing surface of the bearing platform together define a continuous plane.

Further, one portion of the light reflection compensating block is disposed at a top end of the inner wall of the lifting passage, and another portion of the light reflection compensating block is disposed at a lateral side of the supporting portion in such a manner that when the top surface of the supporting portion is coplanar with the bearing surface of the bearing platform, the top surface of the supporting portion, the top surface of the light reflection compensating block and the bearing surface of the bearing platform together define a continuous plane.

Further, the base body includes an outer ring body disposed at the inner wall of the lifting passage, and an inner ring body disposed at the supporting portion. The inner ring body surrounds the supporting portion.

Further, the outer ring body includes an outer surface in contact with the inner wall of the lifting passage, and an inner surface away from the inner wall of the lifting passage. The inner ring body includes an inner surface facing the supporting portion, and an outer surface away from the supporting portion. In a direction from a top end of the lifting structure to a bottom end of the lifting structure, the outer surface of the inner ring body closes to the supporting portion in a gradual manner or in a stepwise manner. The inner surface of the outer ring body matches the outer surface of the inner ring body in such a manner that the outer surface of the inner ring body engages with the inner surface of the outer ring body when the top surface of the supporting portion is coplanar with the bearing surface of the bearing platform.

Further, the light reflection compensating block is disposed at the inner wall of the lifting passage at such a position that when the top surface of the supporting portion is coplanar with the bearing surface of the bearing platform, the top surface of the light reflection compensating block is below a bottom surface of the supporting portion.

Further, a lower end of the lifting portion is hinged to the inner wall of the lifting passage, and an upper end of the lifting portion is hinged to the supporting portion.

Further, the base body is made of flexible material.

Further, there is a gap between the lifting structure and the inner wall of the lifting passage, and the light reflection compensating block is in the gap.

One embodiment of the present disclosure provides an exposure apparatus including the above bearing device.

Further, the exposure apparatus includes a light source.

In one embodiment of the present disclosure, since the light reflection compensating block is disposed in the gap between the lifting structure and an inner wall of the lifting passage, and the difference between the reflectivity ratio of the top surface of the light reflection compensating block and each of the reflectivity ratio of the bearing surface of the bearing platform and the reflectivity ratio of the top surface of the lifting structure is less than or equal to the predetermined threshold value, when one substrate is placed on the bearing platform and incident light is irradiated from the top to the substrate to expose the photoresist on the substrate, an amount of reflected light reflected by the bearing platform to the substrate, an amount of reflected light reflected by the light reflection compensating block to the substrate and an amount of reflected light reflected by the lifting structure to the substrate are substantially the same. As a result, degrees of exposure of the photoresist at different positions of the substrate are more uniform when compared with the related art, thereby improving quality of components formed on the substrate and then improving product yield.

BRIEF DESCRIPTION OF THE DRAWINGS

The accompanying drawings, which are incorporated in and constitute a part of this specification, illustrate embodiments consistent with the disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The implementations set forth in the following description of exemplary embodiments do not represent all implementations consistent with the disclosure. Instead, they are merely examples of devices and methods consistent with aspects related to the disclosure as recited in the appended claims.

Figure 1:
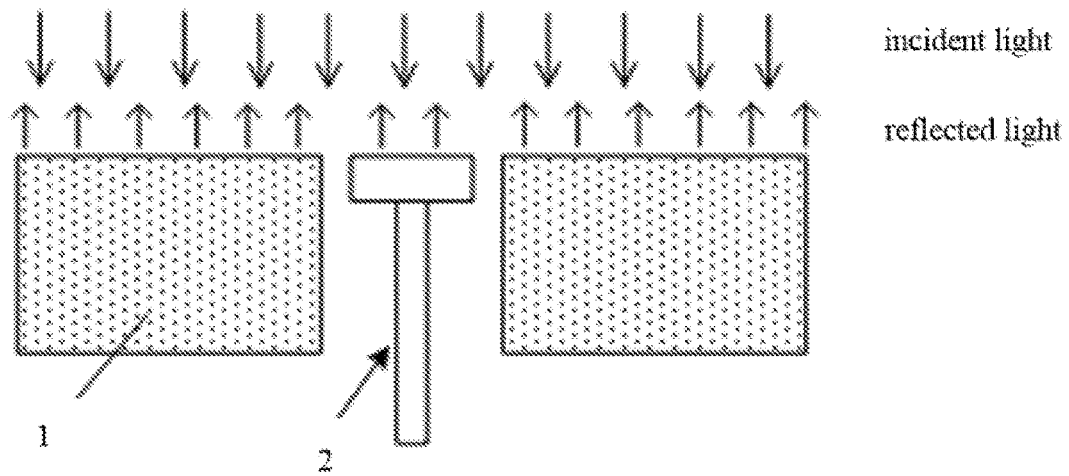
FIG. 1 is a schematic view of a bearing device of an exposure apparatus in the related art.

FIG. 1 is a schematic view of a bearing device of an exposure apparatus in the related art. As shown in FIG. 1, the bearing device includes a bearing platform 1 and a lifting structure 2, such as a lifting rod or a lifting pin. In the exposure process, the lifting structure 2 descends, and a substrate is placed on the bearing platform 1. After completion of the exposure process, the lifting structure 2 is raised up to jack up the substrate, thereby facilitating removal of the substrate.

In the above bearing device, there is certain gap between the lifting structure 2 and the bearing platform 1, and a reflectivity ratio of a region at the gap is different from a reflectivity ratio of a surface of the bearing platform 10. Thus, when a substrate coated with photoresist is processed by the exposure process, exposure rates of the photoresist at different positions of the substrate are different, which easily leads to defective products.

Figure 2:
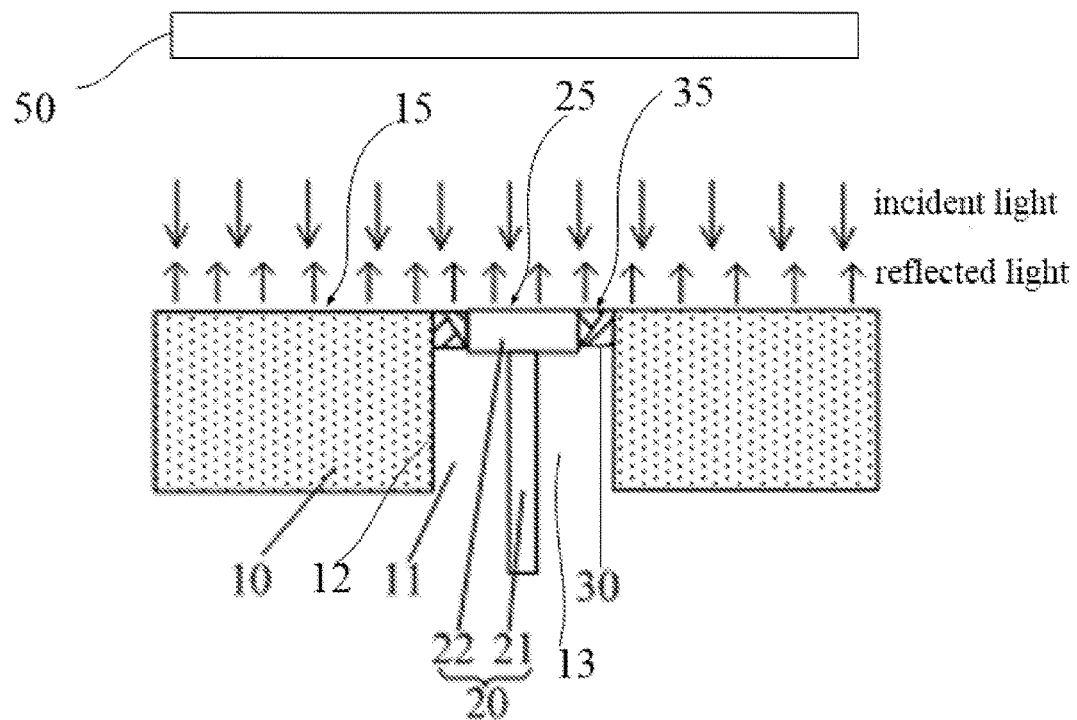
FIG. 2 is a schematic view of a bearing device according to an embodiment of the present disclosure.
Figure 8:
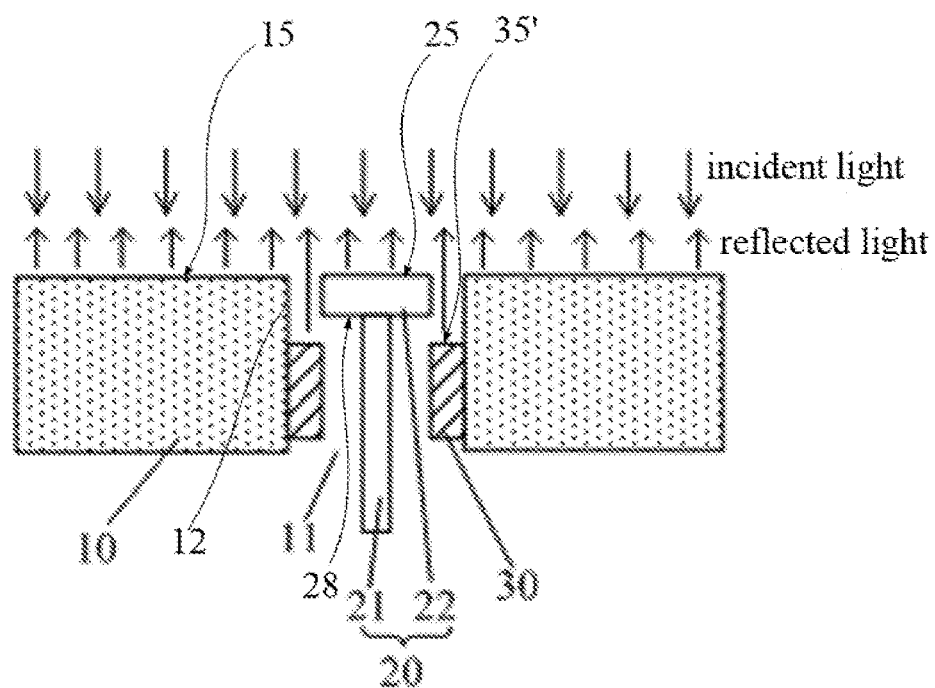
FIG. 8 is a schematic view of a bearing device according to an embodiment of the present disclosure.

In order to solve the above problem in the related art, according to one aspect of the present disclosure, a bearing device is provided. FIG. 2 and FIG. 8 are schematic views of two examples of the bearing device. As shown in FIG. 2 and FIG. 8, the bearing device includes a bearing platform 10, at least one lifting passage 11 extending through the bearing platform 10, and at least one lifting structure 20 disposed in the at least one lifting passage 11. There is a gap 13 between the lifting structure 20 and an inner wall 12 of the lifting passage 11. The bearing device further includes a light reflection compensating block 30 disposed between the lifting structure 20 and the inner wall 12 of the lifting passage 11.

A difference between a reflectivity ratio of a top surface 35 of the light reflection compensating block 30 and a reflectivity ratio of a bearing surface 15 of the bearing platform 10 is less than or equal to a predetermined threshold value. A difference between the reflectivity ratio of the top surface 35 of the light reflection compensating block 30 and a reflectivity ratio of a top surface 25 of the lifting structure 20 is less than or equal to the predetermined threshold value.

The predetermined threshold value may be set to a smaller value, so that the reflectivity ratio of the top surface 35 of the light reflection compensating block 30 is substantially equal to the reflectivity ratio of the bearing surface 15 of the bearing platform 10, and the reflectivity ratio of the top surface 35 of the light reflection compensating block 30 is substantially equal to the reflectivity ratio of the top surface 25 of the lifting structure 20. For example, when the reflectivity ratio of the bearing surface 15 of the bearing platform 10 is 7% and the reflectivity ratio of the top surface 25 of the lifting structure 20 is 5%, the predetermined threshold value may be set to 2%, and then the reflectivity ratio of the top surface 35 of the light reflection compensating block 30 is in a range of from 5% to 7%.

In one embodiment of the present disclosure, since the light reflection compensating block 30 is disposed in the gap 13 between the lifting structure 20 and an inner wall 12 of the lifting passage 11, and the difference between the reflectivity ratio of the top surface 35 of the light reflection compensating block 30 and each of the reflectivity ratio of the bearing surface 15 of the bearing platform 10 and the reflectivity ratio of the top surface 25 of the lifting structure 20 is less than or equal to the predetermined threshold value, when one substrate is placed on the bearing platform 10 and incident light is irradiated from the top to the substrate to expose the photoresist on the substrate, an amount of reflected light reflected by the bearing platform 10 to the substrate, an amount of reflected light reflected by the light reflection compensating block 30 to the substrate and an amount of reflected light reflected by the lifting structure 20 to the substrate are substantially the same. As a result, degrees of exposure of the photoresist at different positions of the substrate are more uniform when compared with the related art, thereby improving quality of components formed on the substrate and then improving product yield.

It should be noted that, the top surface 25 of the lifting structure 20 refers to a surface of the lifting structure 20, which can receive incident light when the incident light is irradiated from the top (when the bearing device is placed in a position shown in FIG. 2) to the lifting structure 20 in a direction perpendicular to the substrate. The surface may be a horizontal surface which is parallel to the bearing surface 15 of the bearing platform 10. The surface may also be an inclined surface, an arc surface or the like.

Optionally, an orthographic projection of the light reflection compensating block 30 on a horizontal plane and an orthographic projection of the lifting structure 20 on the horizontal plane together cover an entire orthographic projection of the lifting passage 11 on the horizontal plane. As a result, any position under the substrate can reflect light to the substrate, i.e., any position of the substrate can receive reflected light.

Further, optionally, the reflectivity ratio of the top surface 25 of the lifting structure 20 is equal to the reflectivity ratio of the bearing surface 15 of the bearing platform 10, and then the predetermined threshold value is 0. In other words, the reflectivity ratio of the top surface 25 of the lifting structure 20, the reflectivity ratio of the bearing surface 15 of the bearing platform 10, and the top surface 35 of the light reflection compensating block 30 are equal to each other. As a result, the amounts of reflected light received at different positions of the substrate are equal to each other, and degrees of exposure of the photoresist at different positions of the substrate are more uniform.

The light reflection compensating block and the lifting structure are described in details hereinafter in conjunction with FIG. 2 to FIG. 8.

Figure 3:
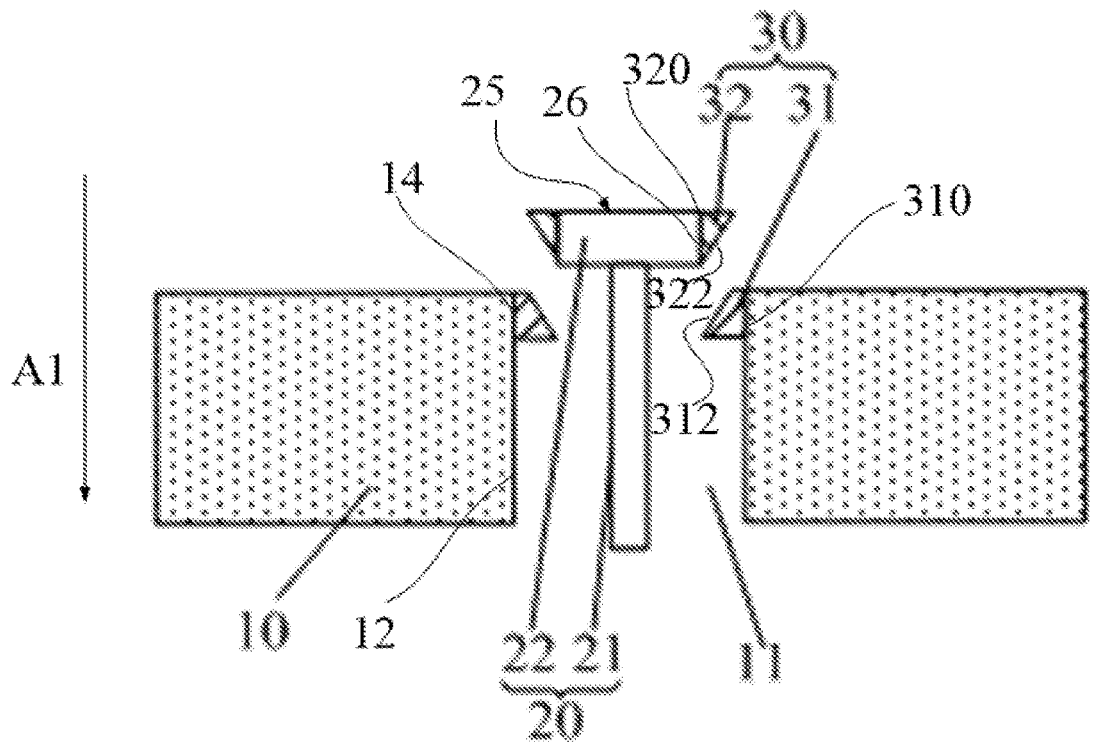
FIG. 3 is a schematic view of a lifting structure of the bearing device shown in FIG. 2, when the lifting structure is raised up.
Figure 4:
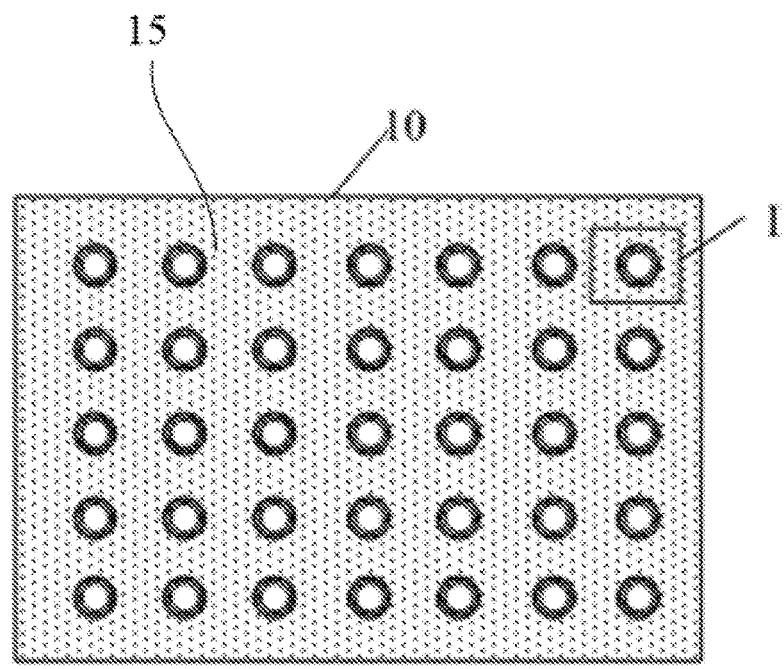
FIG. 4 is top view of a bearing device with lifting passages each having a cross section of a circular shape.
Figure 5:
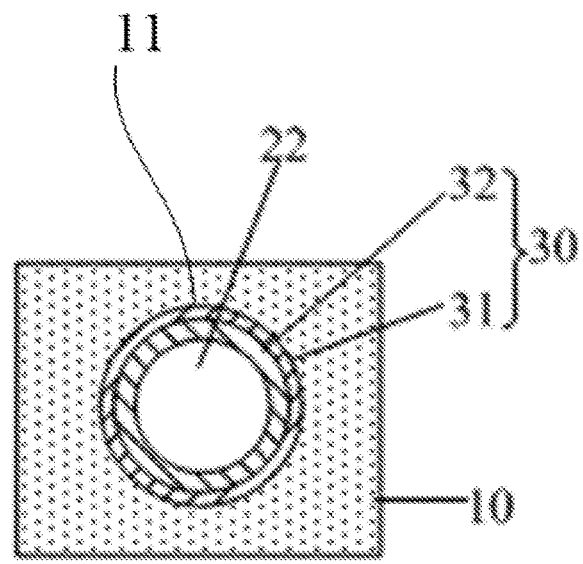
FIG. 5 is a schematic enlarged view of a portion I shown in FIG. 4.
Figure 6:
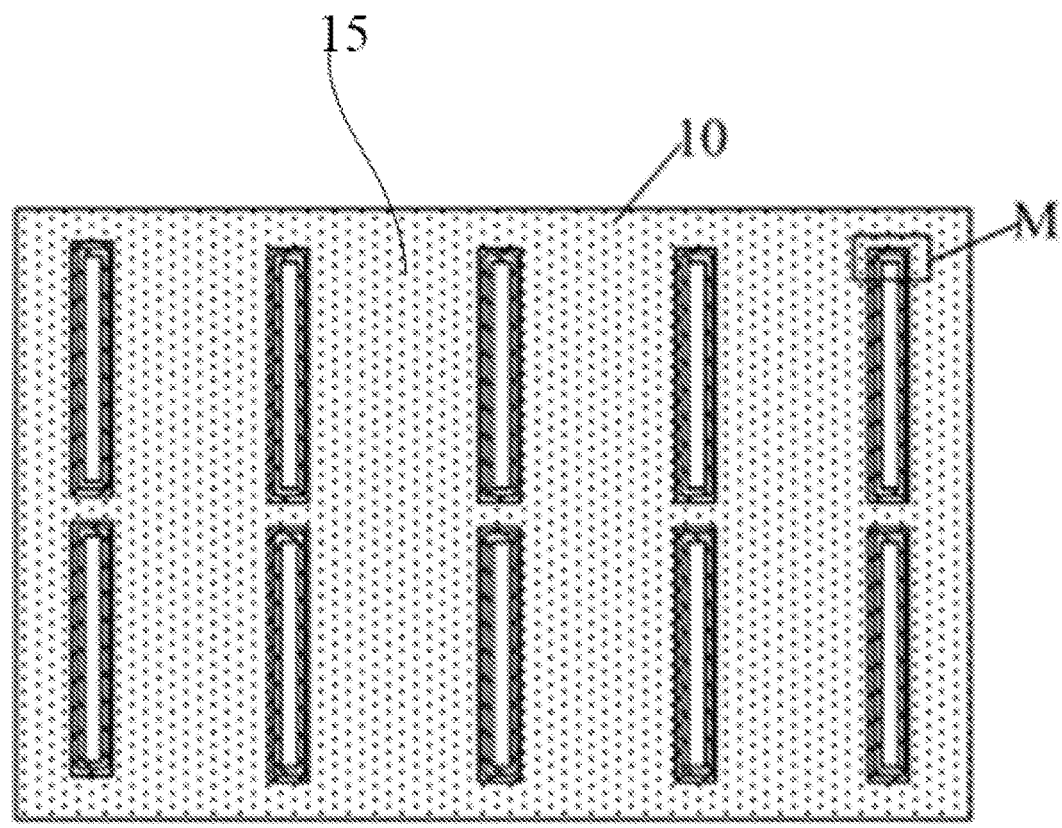
FIG. 6 is top view of a bearing device with lifting passages each having a cross section of a rectangular shape.
Figure 7:
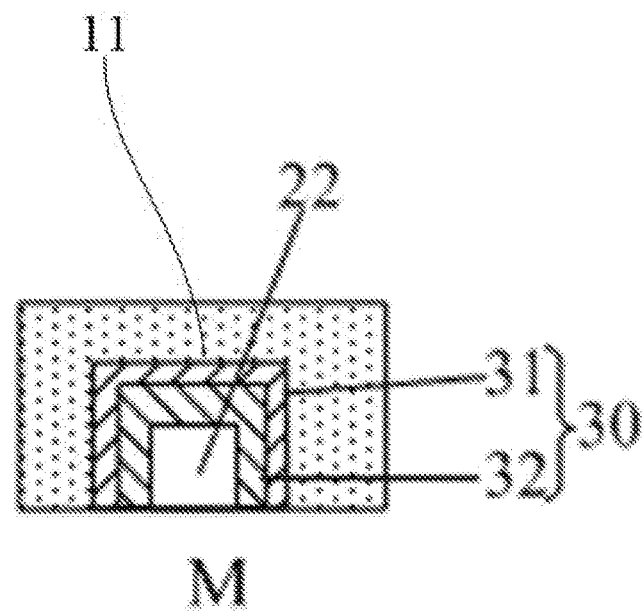
FIG. 7 is a schematic enlarged view of a portion M shown in FIG. 6.

As shown in FIG. 2 to FIG. 8, the lifting structure 20 includes a lifting portion 21 and a supporting portion 22 disposed at a top end of the lifting portion 21. The supporting portion 22 may be a plate structure to increase a contact area between the supporting portion 22 and the substrate, and provides a stable support for the substrate when the lifting structure 20 is raised up. In one embodiment of the present disclosure, as shown in FIG. 4 and FIG. 5, a cross section of the lifting passage 11 in a plane parallel to the bearing surface 15 of the bearing platform 10 (i.e., the horizontal plane, when the lifting structure 20 is in a position shown in FIG. 2) has a shape of a circle. Accordingly, the supporting portion 22 may be a circular plate structure. In other embodiments, as shown in FIG. 6 and FIG. 7, the cross section of the lifting passage 11 in the plane parallel to the bearing surface 15 of the bearing platform 10 may also have a shape of a rectangle. Accordingly, the supporting portion 22 may be a rectangular plate structure.

The lifting portion 21 may have a shape of a rod. The lifting portion 21 may be fixed connected with the supporting portion 22. The lifting portion 21 may be raised up or descended in a straight way (when the lifting structure 20 is in the position shown in FIG. 2).

Figure 9:
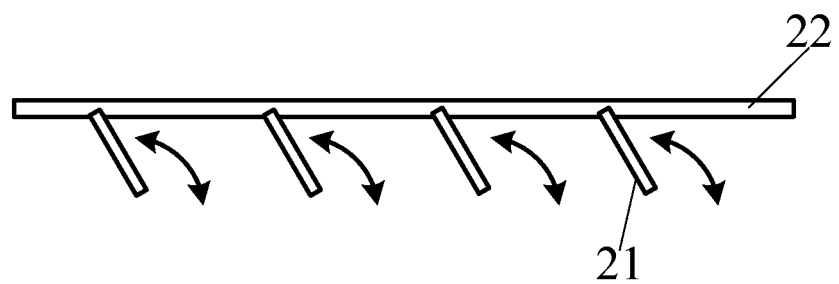
FIG. 9 is a schematic view showing a lifting mode for a lifting structure according to an embodiment of the present disclosure.

In one embodiment, as shown in FIG. 9, one end of the lifting portion 21 may be hinged to a pedestal or the inner wall 12 of the lifting passage 11 of the bearing platform 10, and the other end of the lifting portion 21 is hinged to the supporting portion 22. The lifting portion 21 rotates along a direction indicated with arrows shown in FIG. 9 to drive the supporting portion 22 to rise or descend.

Figure 11:
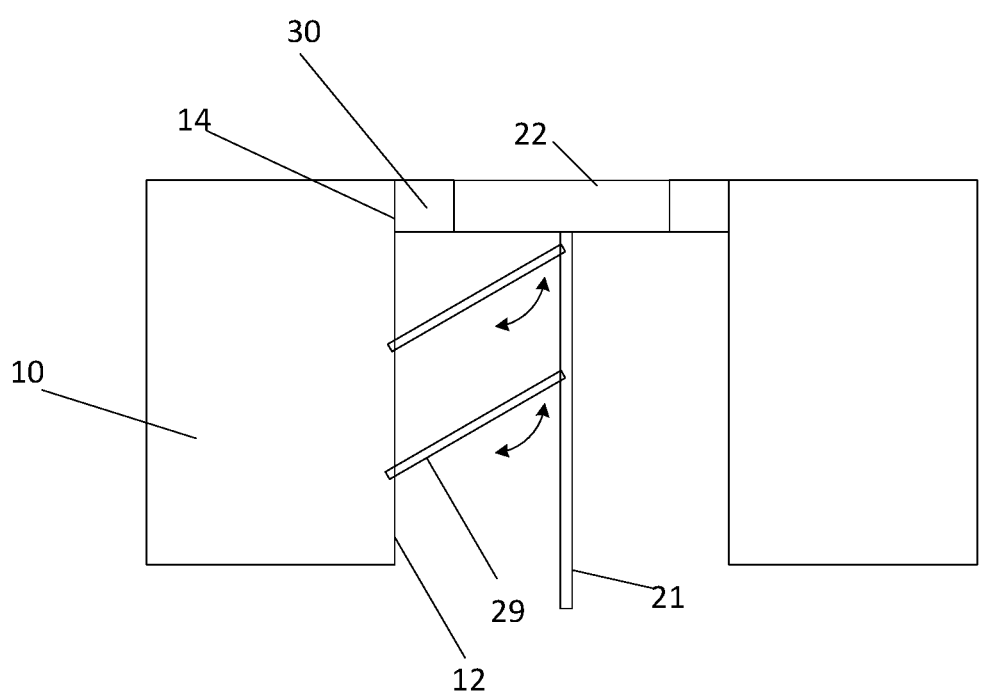
FIG. 11 is a schematic view of a bearing device according to another embodiment of the present disclosure.

In one embodiment, as shown in FIG. 11, the lifting portion 21 may be hinged to the inner wall 12 of the lifting passage 11 through several connection rods 29. One end of the connection rod 29 is hinged to the inner wall 12 of the lifting passage 11, and the other end of the connection rod 29 is hinged to the supporting portion 22. When the connection rods 29 rotate along a direction indicated with arrows shown in FIG. 11, the lifting portion 21 may rise up or descend, and then the supporting portion 22 is driven to rise or descend.

Figure 10:
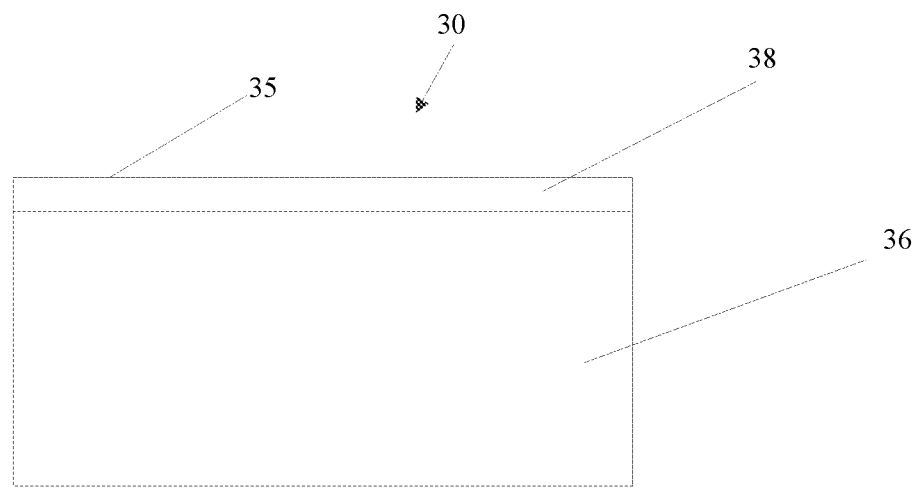
FIG. 10 is a schematic view of a light reflection compensating block of a bearing device according to an embodiment of the present disclosure.

As shown in FIG. 10, the light reflection compensating block 30 includes a base body 36 and a reflective layer 38 on a top surface of the base body 36. A top surface of the reflective layer 38 defines the top surface 35 of the light reflection compensating block 30. It should be noted that, the term "top" herein refers to an upward side shown in FIG. 2 when the lifting structure 20 is in the position shown in FIG. 2.

The base body 36 may be made of wear-resistant flexible material such as rubber, to extend service life and prevent the substrate from being damaged by the light reflection compensating block 30 when the light reflection compensating block 30 is in contact with the substrate. The reflective layer 38 may be coated on the base body 36. Of course, the base body 36 and the reflective layer 38 may be integrally formed.

The light reflection compensating block 30 may be disposed at a top end of the inner wall of the lifting passage 11 or a lateral side of the supporting portion 22. For example, as shown in FIG. 11, the light reflection compensating block 30 may be fixed to the inner wall of the lifting passage 11, or the light reflection compensating block 30 may be disposed at the lateral side of the supporting portion 22. In one embodiment, as shown in FIG. 2 and FIG. 3, one portion of the light reflection compensating block 30 may be disposed at a top end 14 of the inner wall 12 of the lifting passage 11, and the rest portion of the light reflection compensating block 30 is disposed at a lateral side 26 of the supporting portion 22. Further, as shown in FIG. 2, the light reflection compensating block 30 is arranged in the lifting passage 11 in such a manner that when the top surface of the supporting portion 22 (i.e., the top surface 25 of the lifting structure 20) is coplanar with the bearing surface 15 of the bearing platform 10, the top surface of the supporting portion 22, the top surface 35 of the light reflection compensating block 30 and the bearing surface 15 of the bearing platform 10 together define a continuous plane, thereby enabling the substrate to be placed on a flat plane. Such an arrangement can reduce deformation of the substrate, particularly for a substrate of a large size. In addition, a length of a light path of a reflected light from the top surface 35 of the light reflection compensating block 30 to the substrate, a length of a light path of a reflected light from the top surface of the supporting portion 22 to the substrate, and a length of a light path of a reflected light from the bearing surface 15 of the bearing platform 10 to the substrate are equal to each other. This can further ensure that amounts of light received by the photoresist at different positions of the substrate are equal to each other.

In one embodiment of the present disclosure, one arrangement mode of the light reflection compensating block 30 is shown in FIG. 2 and FIG. 3. As shown in FIG. 2 and FIG. 3, one portion of the light reflection compensating block 30 may be disposed at the inner wall 12 of the lifting passage 11, and the rest portion of the light reflection compensating block 30 is disposed at the supporting portion 22. Specifically, the base body 36 of the light reflection compensating block 30 includes an outer ring body 31 disposed at the inner wall 12 of the lifting passage 11, and an inner ring body 32 disposed at the supporting portion 22. The inner ring body 32 surrounds the supporting portion 22. The outer ring body 31 includes an outer surface 310 in contact with the inner wall 12 of the lifting passage 11, and an inner surface 312 away from the inner wall 12 of the lifting passage 11. The inner ring body 32 includes an inner surface 320 facing the supporting portion 22, and an outer surface 322 away from the outer surface 322 of the supporting portion 22. In a direction from a top end of the lifting structure 20 to a bottom end of the lifting structure 20 (i.e., a direction indicated with an arrow A1 shown in FIG. 3), the outer surface 322 of the inner ring body 32 closes to the supporting portion 22 in a gradual manner or in a stepwise manner. The inner surface 312 of the outer ring body 31 matches the outer surface 322 of the inner ring body 32, so that the outer surface 322 of the inner ring body 32 engages with the inner surface 312 of the outer ring body 31 when the top surface of the supporting portion 22 is coplanar with the bearing surface 15 of the bearing platform 10, thereby ensuring that the presence of the inner ring body 32 and the outer ring body 31 do not affect rising of the lifting structure 20 and ensuring that relative positions of the lifting structure 20 and the bearing platform 10 remain stable when the lifting structure 20 descends so as to place one substrate to the bearing platform 10.

In one embodiment of the present disclosure, shapes of the inner ring body 32 and the outer ring body 31 are shown in FIG. 2 and FIG. 3. A longitudinal section of the inner ring body 32 in a plane perpendicular to the bearing surface 15 of the bearing platform 10 includes two spaced triangles. A longitudinal section of the outer ring body 31 in the plane perpendicular to the bearing surface 15 of the bearing platform 10 includes two spaced trapezoids, and a size of an upper bottom of each trapezoid is less than a size of a lower bottom of each trapezoid. In this case, a top surface of the inner ring body 32 and a top surface of the outer ring body 31 together define the top surface 35 of the light reflection compensating block 30. Of course, the base body may also be divided into an upper ring body and a lower ring body.

It should be understood that, the specific shapes of the inner ring body 32 and the outer ring body 31 may be determined according to structures of the supporting portion 22 and the lifting passage 11, and may be a round ring body or a rectangular ring body.

In one embodiment of the present disclosure, another arrangement mode of the light reflection compensating block 30 is shown in FIG. 8. As shown in FIG. 8, the light reflection compensating block 30 may be disposed at the inner wall 12 of the lifting passage 11 at such a position that when the top surface of the supporting portion 22 is coplanar with the bearing surface 15 of the bearing platform 10, a top surface 35' of the light reflection compensating block 30 is below a bottom surface 28 of the supporting portion 22. Since the lifting portion 21 has a smaller lateral dimension in a direction parallel to the bearing surface 15 of the bearing platform 10, a large install space is proved for mounting the light reflection compensating block 30 when the top surface 35' of the light reflection compensating block 30 is below the bottom surface 28 of the supporting portion 22. Further, a projection of the light reflection compensating block 30 on the horizontal plane may be in contact with a projection of the supporting portion 22 on the horizontal plane, and does not overlap the projection of the supporting portion 22 on the horizontal plane. Of course, the projection of the light reflection compensating block 30 on the horizontal plane may overlap the projection of the supporting portion 22 on the horizontal plane, to reduce process difficulty.

According to another aspect of the present disclosure, an exposure apparatus is provided. The exposure apparatus includes the above bearing device. The exposure apparatus may further include a light source 50 (shown in FIG. 2) which irradiates light to the bearing device so as to expose photoresist on one substrate. Since reflectivity ratios of different bearing positions of the bearing device are substantially equal to each other, degrees of exposure of the photoresist at different positions of the substrate are substantially the same when the exposure apparatus is used to expose the photoresist on the substrate, thereby improving quality of products.

As can be seen from the above description of the bearing device and the exposure apparatus provided in embodiments of the present disclosure, since the light reflection compensating block is disposed in the gap between the bearing platform and the lifting structure of the bearing device, and the reflectivity ratio of the top surface of the light reflection compensating block is substantially equal to the reflectivity ratio of the bearing surface of the bearing platform, and the reflectivity ratio of the top surface of the light reflection compensating block is substantially equal to the reflectivity ratio of the top surface of the lifting structure, when one substrate is placed on the bearing platform and incident light is irradiated from the top to the substrate to expose the photoresist on the substrate, an amount of reflected light reflected by the bearing platform to the substrate, an amount of reflected light reflected by the light reflection compensating block to the substrate and an amount of reflected light reflected by the lifting structure to the substrate are substantially the same. As a result, degrees of exposure of the photoresist at different positions of the substrate are more uniform when compared with the related art, thereby improving quality of products.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:
1. A bearing device comprising:
   a bearing platform;
   a lifting passage extending through the bearing platform;
   a lifting structure in the lifting passage; and
   a light reflection compensating block between the lifting structure and an inner wall of the lifting passage; wherein
   a difference between a reflectivity ratio of a top surface of the light reflection compensating block and a reflectivity ratio of a bearing surface of the bearing platform is less than or equal to a threshold value, and a difference between the reflectivity ratio of the top surface of the light reflection compensating block and a reflectivity ratio of a top surface of the lifting structure is less than or equal to the threshold value;
   the light reflection compensating block comprises a base body and a reflective layer on a top surface of the base body, and a surface of the reflective layer defines the top surface of the light reflection compensating block;
   the lifting structure includes a lifting portion and a supporting portion at a top end of the lifting portion, and a top surface of the supporting portion defines the top surface of the lifting structure;
   the base body includes an outer ring body disposed at the inner wall of the lifting passage, and an inner ring body disposed at the supporting portion, and wherein the inner ring body surrounds the supporting portion.

2. The bearing device of claim 1, wherein an orthographic projection of the light reflection compensating block on a horizontal plane and an orthographic projection of the lifting structure on the horizontal plane together completely cover an orthographic projection of the lifting passage on the horizontal plane.

3. The bearing device of claim 1, wherein an orthographic projection of the light reflection compensating block on a plane parallel to the bearing surface of the bearing platform and an orthographic projection of the lifting structure on the plane parallel to the bearing surface of the bearing platform together completely cover an orthographic projection of the lifting passage on the plane parallel to the bearing surface of the bearing platform.

4. The bearing device of claim 1, wherein the reflectivity ratio of the top surface of the lifting structure is equal to the reflectivity ratio of the bearing surface of the bearing platform, and the threshold value is 0.

5. The bearing device of claim 1, wherein the supporting portion is a plate structure.

6. The bearing device of claim 1, wherein one portion of the light reflection compensating block is disposed at a top end of the inner wall of the lifting passage, and another portion of the light reflection compensating block is disposed at a lateral side of the supporting portion in such a manner that when the top surface of the supporting portion is coplanar with the bearing surface of the bearing platform, the top surface of the supporting portion, the top surface of the light reflection compensating block and the bearing surface of the bearing platform together define a continuous plane.

7. The bearing device of claim 1, wherein the outer ring body includes an outer surface in contact with the inner wall of the lifting passage, and an inner surface away from the inner wall of the lifting passage; and the inner ring body includes an inner surface facing the supporting portion, and an outer surface away from the supporting portion;
   wherein in a direction from a top end of the lifting structure to a bottom end of the lifting structure, the outer surface of the inner ring body closes to the supporting portion in a gradual manner or in a stepwise manner; and
   wherein the inner surface of the outer ring body matches the outer surface of the inner ring body in such a manner that the outer surface of the inner ring body engages with the inner surface of the outer ring body when the top surface of the supporting portion is coplanar with the bearing surface of the bearing platform.

8. The bearing device of claim 1, wherein the base body is made of flexible material.

9. The bearing device of claim 1, wherein there is a gap between the lifting structure and the inner wall of the lifting passage, and the light reflection compensating block is in the gap.

10. An exposure apparatus comprising a bearing device, wherein the bearing device comprises:
    a bearing platform;
    a lifting passage extending through the bearing platform;
    a lifting structure in the lifting passage; and
    a light reflection compensating block between the lifting structure and an inner wall of the lifting passage;
    wherein
    a difference between a reflectivity ratio of a top surface of the light reflection compensating block and a reflectivity ratio of a bearing surface of the bearing platform is less than or equal to a threshold value, and a difference between the reflectivity ratio of the top surface of the light reflection compensating block and a reflectivity ratio of a top surface of the lifting structure is less than or equal to the threshold value;
    the light reflection compensating block comprises a base body and a reflective layer on a top surface of the base body, and a surface of the reflective layer defines the top surface of the light reflection compensating block;
    the lifting structure includes a lifting portion and a supporting portion at a top end of the lifting portion, and a top surface of the supporting portion defines the top surface of the lifting structure;
    a lower end of the lifting portion is hinged to the inner wall of the lifting passage, and an upper end of the lifting portion is hinged to the supporting portion.

11. The exposure apparatus of claim 10, further comprising a light source.

* * * * *